(12) United States Patent
Wang et al.

(10) Patent No.: US 7,515,061 B2
(45) Date of Patent: Apr. 7, 2009

(54) LED PACKAGE STRUCTURE FOR INCREASING LIGHT-EMITTING EFFICIENCY AND METHOD OF PACKAGING THE SAME

(75) Inventors: Bily Wang, Hsin Chu (TW); Jonnie Chuang, Pan Chiao (TW); Chi-Wen Hung, Hsinchu (TW)

(73) Assignee: Harvatek Corporation, Hsin Chu (TW)

( * ) Notice: Subject to any disclaimer, the term of this patent is extended or adjusted under 35 U.S.C. 154(b) by 284 days.

(21) Appl. No.: 11/588,399

(22) Filed: Oct. 27, 2006

(65) Prior Publication Data
US 2008/0099778 A1     May 1, 2008

(51) Int. Cl.
  *G08B 5/22* (2006.01)
(52) U.S. Cl. .............. 340/815.45; 340/815.4; 257/678; 257/99
(58) Field of Classification Search .......... 340/815.4, 340/815.45; 257/678, 98, 99, 684, 687, 666, 257/668, 79, 13, 103, 458, 749, 918; 438/22, 438/24, 29, 40, 46, 47, 106–108, 118, 127; 313/512
See application file for complete search history.

(56) References Cited
U.S. PATENT DOCUMENTS
6,737,679 B2 *  5/2004  Lin et al. ................... 257/79
6,909,234 B2 *  6/2005  Chen ......................... 313/512
7,253,449 B2 *  8/2007  Wu ............................. 257/99
2004/0222413 A1 * 11/2004  Hsu et al. .................... 257/40
2007/0170563 A1 *  7/2007  Chen ......................... 257/678

* cited by examiner

*Primary Examiner*—Anh V La
(74) *Attorney, Agent, or Firm*—Rosenberg, Klein & Lee

(57) ABSTRACT

An LED package structure for increasing light-emitting efficiency includes: a substrate unit, and a plurality of fluorescence colloid units, LED units, conductive units and opaque units. The substrate unit has a main body and a plurality of through holes passing through the main body. Each fluorescence colloid unit is received in the corresponding through hole and having an installed surface. Each LED unit has a light-emitting surface disposed on the corresponding fluorescence colloid unit and facing the installed surface of the corresponding fluorescence colloid units. Each conductive unit is electrically connected between each two electrode areas that have the same pole and are respectively arranged on each LED unit and the main body. Each opaque unit is disposed on two corresponding lateral faces of the main body for covering the installed surface of the corresponding fluorescence colloid unit, the corresponding LED unit, and the corresponding conductive units.

20 Claims, 8 Drawing Sheets

LED PACKAGE STRUCTURE FOR INCREASING LIGHT-EMITTING EFFICIENCY AND METHOD OF PACKAGING THE SAME

BACKGROUND OF THE INVENTION

1. Field of the Invention

The present invention relates to an LED package structure for increasing light-emitting efficiency and a method of packaging the same, and particularly relates to an LED having a light-emitting surface attached on a fluorescence colloid. Hence, the LED's light can projected outwardly through the fluorescence colloid without any hindrances.

2. Description of the Related Art

Referring to FIG. 1, a known LED package structure that is packaged via a wire-bonding method. The known LED package structure includes a substrate 1a, a plurality of LEDs 2a disposed on the substrate, a plurality of wires 3a, and a plurality of fluorescence colloids 4a.

Each LED 2a has a light-emitting surface 20a opposite to the substrate 1a. Each LED 2a has a positive pole area 21a and a negative pole area 22a electrically connected to two corresponding positive and negative pole areas 11a, 12a of the substrate 1a via two corresponding wires 3a respectively. Moreover, each fluorescence colloid 4a is covered on the corresponding LED 2a and two corresponding wires 3a for protecting the corresponding LED 2a.

However, the two sides of two wires 3a are respectively disposed on the positive and negative pole areas 21a, 22a. Hence, when light source of the LED 2a is projected outwardly from the light-emitting surface 20a and through the fluorescence colloid 4a, the two wires 3a will produce two projected shadow lines shadowed on the LED 2a and then affect the LED's light-emitting efficiency.

In order to solve above-mentioned question, the prior art provides another known LED package structure that is packaged via a flip-chip method. Using the flip-chip method, firstly two solder balls 3b (or gold bump) are respectively arranged on two positive and negative pole areas 21b, 22b that are formed on a surface opposite to a light-emitting surface 20b of a LED 2b. The light-emitting surface 20b is upward, and the two positive and negative pole areas 21b, 22b are connected with two positive and negative pole areas 11b, 12b of a substrate 1b via the two solder ball 3b (or gold bump) respectively. Moreover, a fluorescence colloid 4b is covered on the LED 2b. Hence, when light source of the LED 2b is projected outwardly from the light-emitting surface 20b and through the fluorescence colloid 4b, there is no any projected shadow area shadowed on the LED 2b and the LED 2b can keep an original light-emitting efficiency.

However, the flip-chip method has some defects, as follows:

1. Because the flip-chip process needs a professional apparatus, the manufacturing cost is increased.

2. Because the flip-chip process is slower than the wire-bonding process, the product efficiency is decreased.

3. The LED 2b is hard to be positioned in the flip-chip process.

4. The light loss will occur under the LED 2b due to light's refraction. Hence, the light efficiency of the LED 2b is decreased.

SUMMARY OF THE INVENTION

The present invention provides an LED package structure for increasing light-emitting efficiency and a method of packaging the same. An LED of the present invention can be packaged on a substrate via a wire-bonding process, and a fluorescence colloid of the present invention can be covered on the LED via a way of die molding, printing, or injection molding. Moreover, the LED's light-emitting surface is disposed on the fluorescence colloid. Hence, when light source of the LED is projected outwardly from the light-emitting surface and through the fluorescence colloid, there is no any projected shadow area shadowed on the LED. So the present invention can solve the prior art's question that there are projected shadow lines shadowed on the LED.

A first aspect of the present invention is an LED package structure for increasing light-emitting efficiency, comprising: a substrate unit, a plurality of fluorescence colloid units, a plurality of LED units, a plurality of conductive units and a plurality of opaque units. The substrate unit has a main body and a plurality of through holes passing through the main body. Each fluorescence colloid unit is received in the corresponding through hole and having an installed surface. Each LED unit has a light-emitting surface disposed on the corresponding fluorescence colloid unit and facing the installed surface of the corresponding fluorescence colloid units. Each conductive unit is electrically connected between each two electrode areas that have the same pole and are respectively arranged on each LED unit and the main body. Each opaque unit is disposed on two corresponding lateral faces of the main body for covering the installed surface of the corresponding fluorescence colloid unit, the corresponding LED unit, and the corresponding conductive units.

Moreover, the LED package structure further comprises a plurality of light-condensing units corresponding to the LED units, and each light-condensing unit has two opaque blocks respectively disposed on the main body's another two corresponding lateral faces that are opposite to the two corresponding lateral faces of the main body for condensing light source that projects from the corresponding LED unit and through the corresponding opaque unit.

Furthermore, the main body has a plurality of pairs of lead angle portions, and each pair of lead angle portions are respectively formed on the main body's two corresponding lateral edges for condensing light source that projects from the corresponding LED unit and through the corresponding opaque unit.

In addition, the LED package structure further comprises a plurality of antistatic units, and each antistatic unit is disposed on the main body and beside one side of the corresponding LED unit. Moreover, each antistatic unit has a positive pole area and a negative pole area electrically connected with two corresponding negative and positive pole areas via two corresponding conductive units respectively, and each two negative and positive pole areas are respectively disposed on two lateral faces of the main body and beside two sides of the corresponding LED unit.

A second aspect of the present invention is a method of packaging an LED package structure for increasing light-emitting efficiency, comprising: providing a substrate unit that has a main body and a plurality of through holes passing through the main body; receiving a plurality of fluorescence colloid units in the corresponding through holes respectively, wherein each fluorescence colloid unit has an installed surface; disposing a plurality of LED units on the corresponding fluorescence colloid units respectively, wherein each LED unit has a light-emitting surface disposed on the corresponding fluorescence colloid unit and facing the installed surface of the corresponding fluorescence colloid unit; providing a plurality of conductive units, wherein each conductive unit is electrically connecting between each two electrode areas that have the same pole and are respectively arranged on each LED unit and the main body; and providing a plurality of opaque units, wherein each opaque unit is disposed on two corresponding lateral faces of the main body for covering the installed surface of the corresponding fluorescence colloid unit, the corresponding LED unit, and the corresponding conductive units.

Moreover, the LED package structure further comprises a plurality of light-condensing units corresponding to the LED units, and each light-condensing unit has two opaque blocks respectively disposed on the main body's another two corresponding lateral faces that are opposite to the two corresponding lateral faces of the main body for condensing light source that projects from the corresponding LED unit and through the corresponding opaque unit.

Furthermore, the main body has a plurality of pairs of lead angle portions, and each pair of lead angle portions are respectively formed on the main body's two corresponding lateral edges for condensing light source that projects from the corresponding LED unit and through the corresponding opaque unit.

In addition, the LED package structure further comprises a plurality of antistatic units, and each antistatic unit is disposed on the main body and beside one side of the corresponding LED unit. Moreover, each antistatic unit has a positive pole area and a negative pole area electrically connected with two corresponding negative and positive pole areas via two corresponding conductive units respectively, and each two negative and positive pole areas are respectively disposed on two lateral faces of the main body and beside two sides of the corresponding LED unit.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF PREFERRED BEST MOLDS

Figure 1:
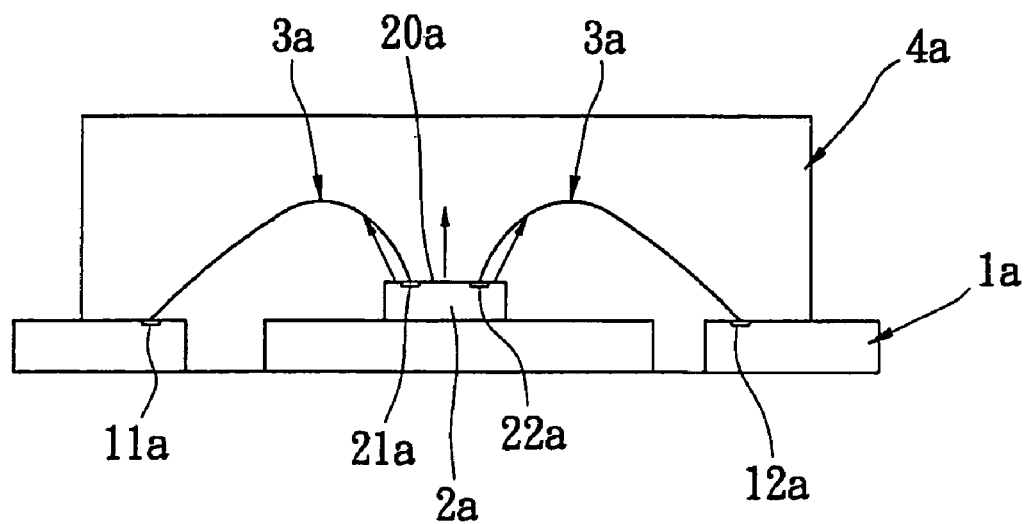
FIG. 1 is a cross-sectional, schematic view of an LED package structure for increasing light-emitting efficiency via a wire-bonding method according to the prior art.
Figure 2:
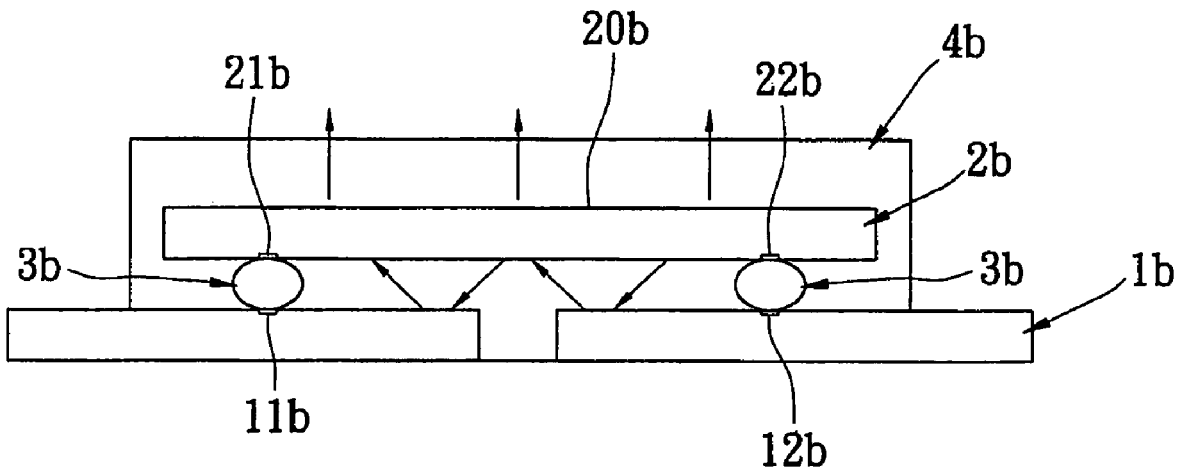
FIG. 2 is a cross-sectional, schematic view of an LED package structure for increasing light-emitting efficiency via a flip-chip method according to the prior art.
Figure 3:
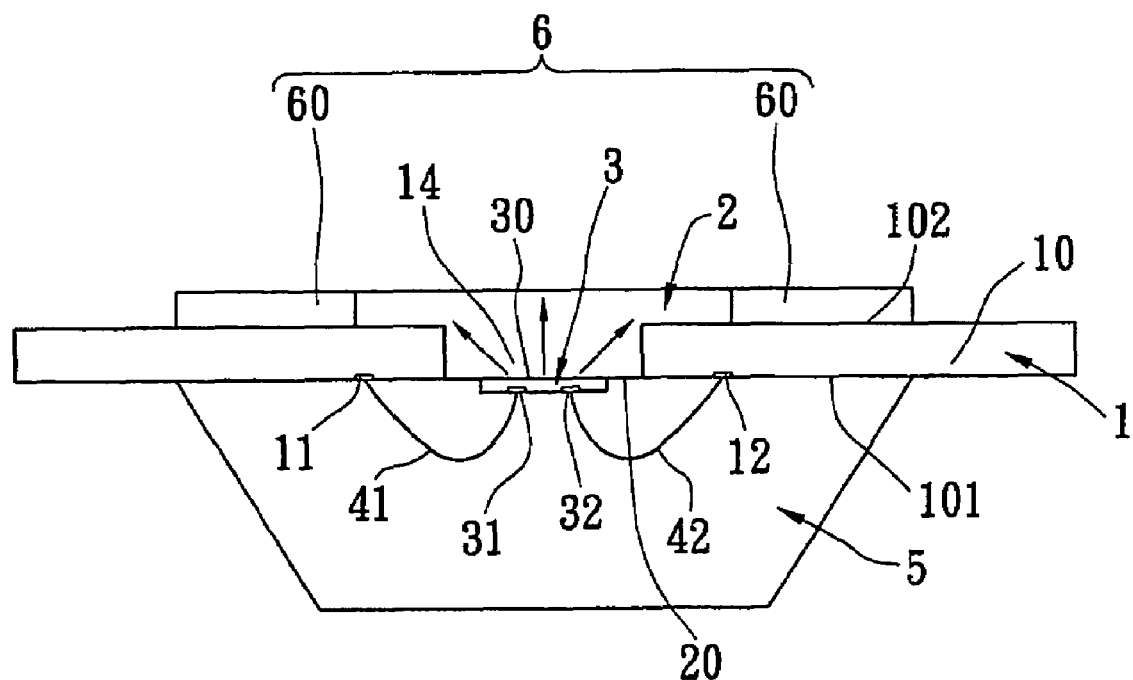
FIG. 3 is a cross-sectional, schematic view of an LED package structure for increasing light-emitting efficiency according to the first embodiment of the present invention.

Referring to FIG. 3, the first embodiment of the present invention provides an LED package structure for increasing light-emitting efficiency, comprising: a substrate 1, a plurality of fluorescence colloid units 2, a plurality of LED units 3, a plurality of conductive units, and a plurality of opaque units 5.

The substrate unit 1 has a main body 10 and a plurality of through holes 14 passing through the main body 10. The through holes 14 can be formed in the main body 10 via a way of etching or punching, or any forming way. Moreover, each fluorescence colloid unit 2 is received in the corresponding through hole 14 and has an installed surface 20. The fluorescence colloid units 2 can be respectively received in the through holes 14 via a way of die molding, printing or injection molding, or any receiving way.

Furthermore, each LED unit 3 is disposed on the corresponding fluorescence colloid unit 2 and has a light-emitting surface 30 facing the corresponding installed surface 20 of the corresponding fluorescence colloid unit 2.

In addition, each conductive unit is electrically connected between each two corresponding electrode areas that have the same pole and are respectively arranged on each LED unit 3 and the main body 10. In other words, each LED unit 3 has a positive pole area 31 and a negative pole area 32 electrically connected with two corresponding positive and negative pole areas 11, 12 via two corresponding conductive units 41, 42 respectively, and the two corresponding positive and negative pole areas 11, 12 are disposed on two first lateral faces 101 of the main body 1 and beside two sides of the corresponding LED unit 3. However, the illustration of position of the positive and negative pole areas does not used to limit the present invention. The positive and negative pole areas can be exchanged according to designer's need.

Moreover, each opaque unit 5 is disposed on the main body 1 for covering the installed surface 20 of the corresponding fluorescence colloid unit 2, the corresponding LED unit 3, and the corresponding conductive units 41, 42.

Furthermore, the LED package structure of the first embodiment further comprises a plurality of light-condensing units 6 corresponding to the LED units 3. Each light-condensing unit 6 has two opaque blocks 60 respectively disposed on two corresponding second lateral faces 102 of the main body 10, and the two lateral faces 102 are opposite to the two first lateral faces 101 of the main body 10 for condensing light source that projects from the corresponding LED unit 3 through the corresponding opaque unit 2.

Figure 4:
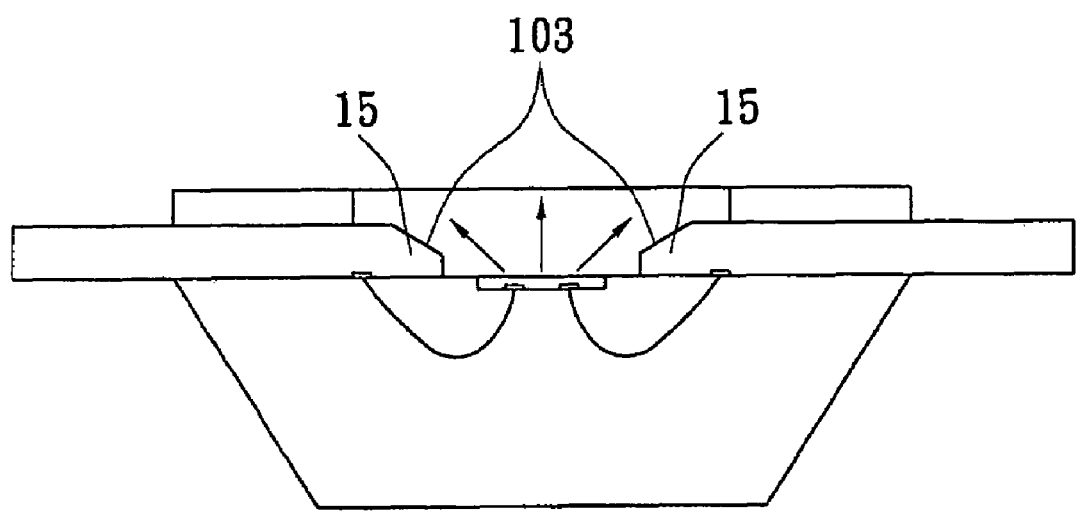
FIG. 4 is a cross-sectional, schematic view of an LED package structure for increasing light-emitting efficiency according to the second embodiment of the present invention.

Referring to FIG. 4, the second embodiment of the present invention provides an LED package structure for increasing light-emitting efficiency. The difference between the second embodiment and the first embodiment is that the main body 10 has a plurality of pairs of lead angle portions 15. Each pair of lead angle portions 15 are disposed on two corresponding lateral edges 103 of the main body 10, and the two corresponding lateral edges 103 are for condensing light source that projects from the corresponding LED unit 3 and through the corresponding opaque unit 2.

Figure 5:
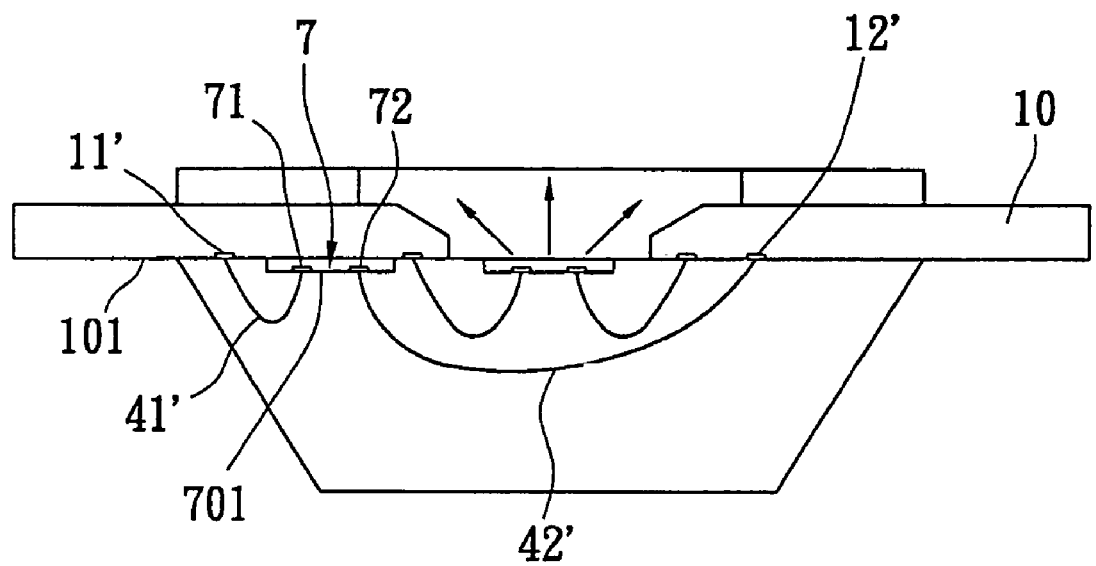
FIG. 5 is a cross-sectional, schematic view of an LED package structure for increasing light-emitting efficiency according to the third embodiment of the present invention.

Referring to FIG. 5, the third embodiment of the present invention provides an LED package structure for increasing light-emitting efficiency. The difference between the third embodiment and the second embodiment is that the LED package structure of the third embodiment further comprises a plurality of antistatic units 7. Each antistatic unit 7 is disposed on the first lateral face 101 of the main body 10 and beside one side of the corresponding LED unit 3. Moreover, each antistatic unit 7 has a positive pole area 71 and a negative pole area 72 electrically connected with two corresponding negative and positive pole areas 11', 12' via two corresponding conductive units 41', 42' respectively. In addition, each antistatic unit 7 is used to prevent the corresponding LED unit 3 from being affected or damaged by static.

Furthermore, the positive pole area 71 and the negative pole area 72 of each antistatic unit 7 are disposed on a top side 701 of each antistatic unit 7. In addition, each two negative and positive pole areas 71, 72 are respectively disposed on the two corresponding first lateral faces 101 of the main body 10 and beside two sides of the corresponding LED unit 3.

Figure 6:
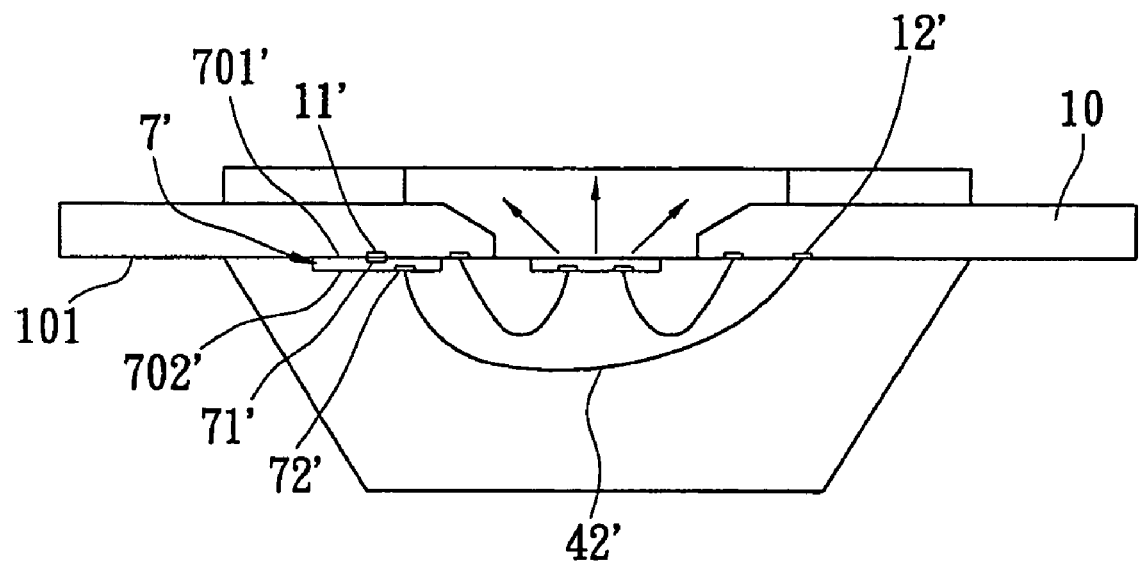
FIG. 6 is a cross-sectional, schematic view of an LED package structure for increasing light-emitting efficiency according to the fourth embodiment of the present invention.

Referring to FIG. 6, the fourth embodiment of the present invention provides an LED package structure for increasing light-emitting efficiency. The difference between the fourth embodiment and the third embodiment is that a positive pole area 71' and a negative pole area 72' of each antistatic unit 7' are disposed on a bottom side 701' and a top side 702' of each antistatic unit 7'. Hence, the positive pole area 71' of each antistatic unit 7' is directly electrically connecting with the negative pole area 11', and the negative pole area 72' of each antistatic unit 7' is electrically connected with the positive pole area 12' via the conductive unit 42' for preventing the corresponding LED unit 3 from being affected or damaged by static.

However, the positions of the antistatic units 7, 7' and the definition of the positive and negative pole areas do not use to limit the present invention. The designer can choose the positions of the antistatic units 7, 7' and exchange the positive and negative pole areas according to practice needs.

Figure 7:
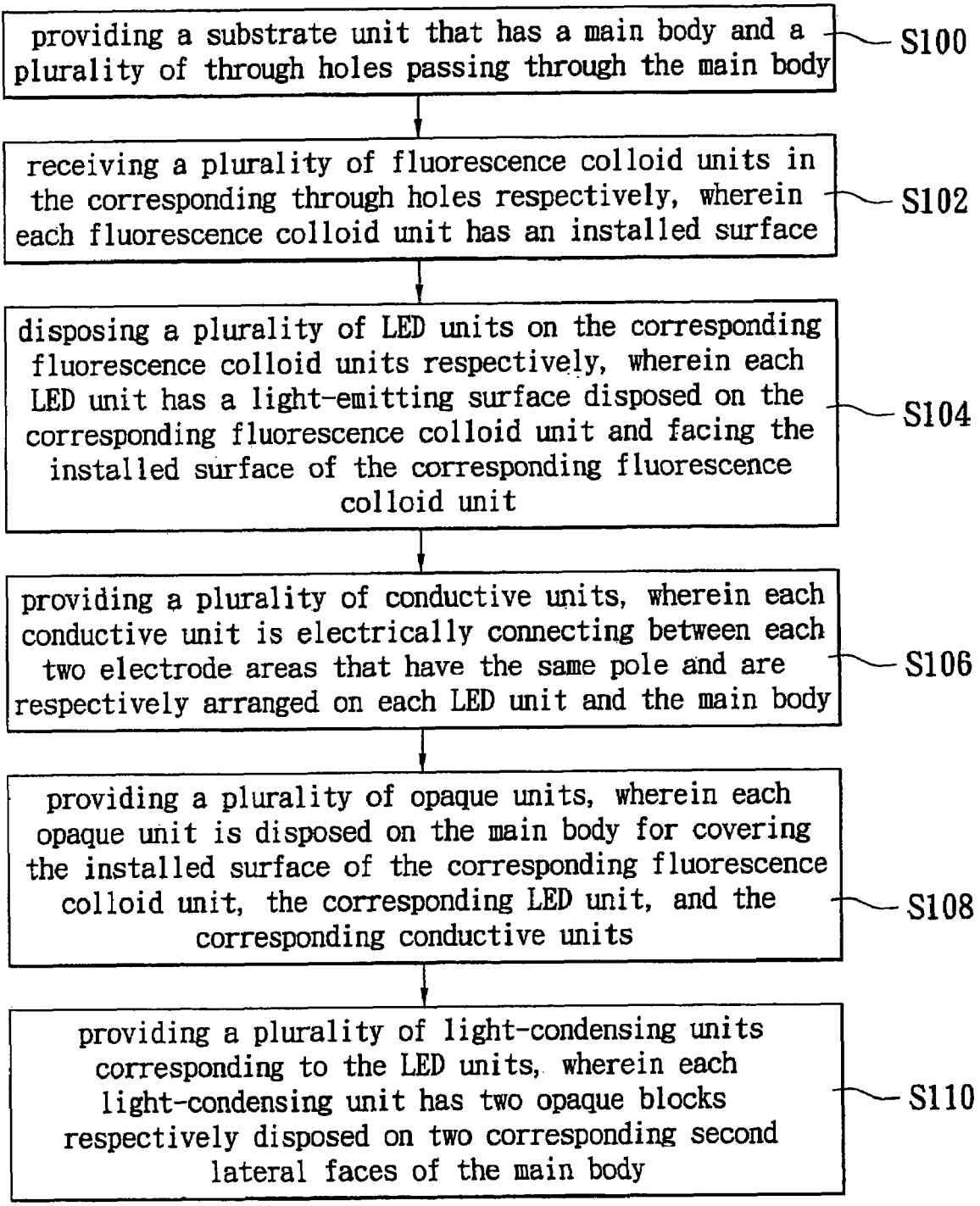
FIG. 7 is a flow chart of a method of packaging an LED package structure for increasing light-emitting efficiency according to the first embodiment of the present invention.
Figure 8A:
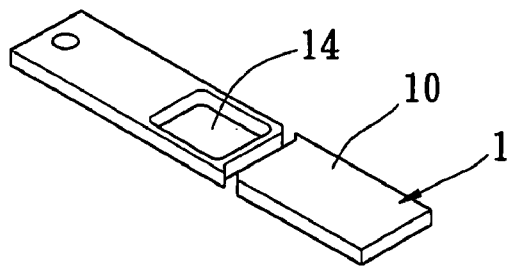
FIGS. 8A-8D are perspective, schematic views of a method of packaging an LED package structure for increasing light-emitting efficiency according to the first embodiment of the present invention.
Figure 8B:
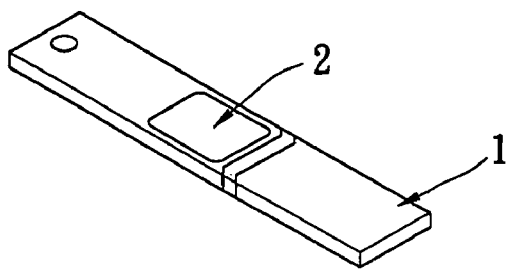

Referring to FIGS. 7 and 8A-8D, a method of packaging an LED package structure for increasing light-emitting efficiency is disclosed according to the first embodiment. The method of the first embodiment comprises: as shown in FIGS. 3, 7 and 8A, firstly providing a substrate unit 1 that has a main body 10 and a plurality of through holes 14 passing through the main body 10 (S100), and then as shown in FIGS. 3, 7 and 8B, receiving a plurality of fluorescence colloid units 2 in the corresponding through holes 14 respectively, and each fluorescence colloid unit 2 having an installed surface 20 (S102).

Moreover, the through holes 14 can be formed in the main body 10 via a way of etching or punching, or any forming way. In addition, the fluorescence colloid units 2 can be respectively received in the through holes 14 via a way of die molding, printing or injection molding, or any receiving way.

Figure 8C:
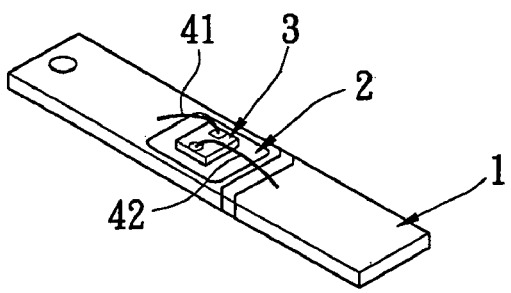

Next, the method further comprises: as shown in FIGS. 3, 7 and 8C, disposing a plurality of LED units 3 on the corresponding fluorescence colloid units 2 respectively, and each LED unit 3 having a light-emitting surface 30 disposed on the corresponding fluorescence colloid unit 2 and facing the installed surface 20 of the corresponding fluorescence colloid unit 2 (S104), and then providing a plurality of conductive units, and each conductive unit electrically connecting between each two electrode areas that have the same pole and are respectively arranged on each LED unit 3 and the main body 10 (S106). In other words, each LED unit 3 has a positive pole area 31 and a negative pole area 32 electrically connected with two corresponding positive and negative pole areas 11, 12 via two corresponding conductive units 41, 42 respectively, and the two corresponding positive and negative pole areas 11, 12 are disposed on two first lateral faces 101 of the main body 1 and beside two sides of the corresponding LED unit 3.

Figure 8D:
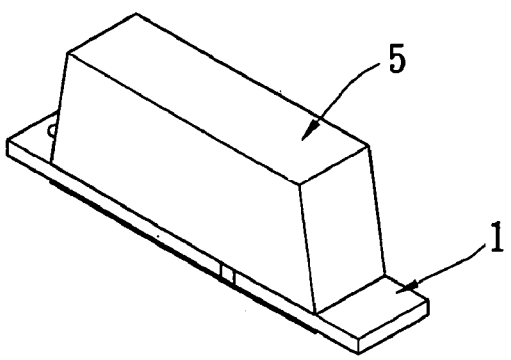

Furthermore, the method further comprises: as shown in FIGS. 3, 7 and 8D, providing a plurality of opaque units 5, and each opaque unit 5 disposed on the main body 10 for covering the installed surface 20 of the corresponding fluorescence colloid unit 2, the corresponding LED unit 3, and the corresponding conductive units 41, 42 (S108).

Finally, the method further comprises: providing a plurality of light-condensing units 6 corresponding to the LED units 3, and each light-condensing unit 6 having two opaque blocks 60 respectively disposed on two corresponding second lateral faces 102 of the main body 10 (S110) for condensing light source that projects from the corresponding LED unit 3 through the corresponding opaque unit 2.

Figure 9:
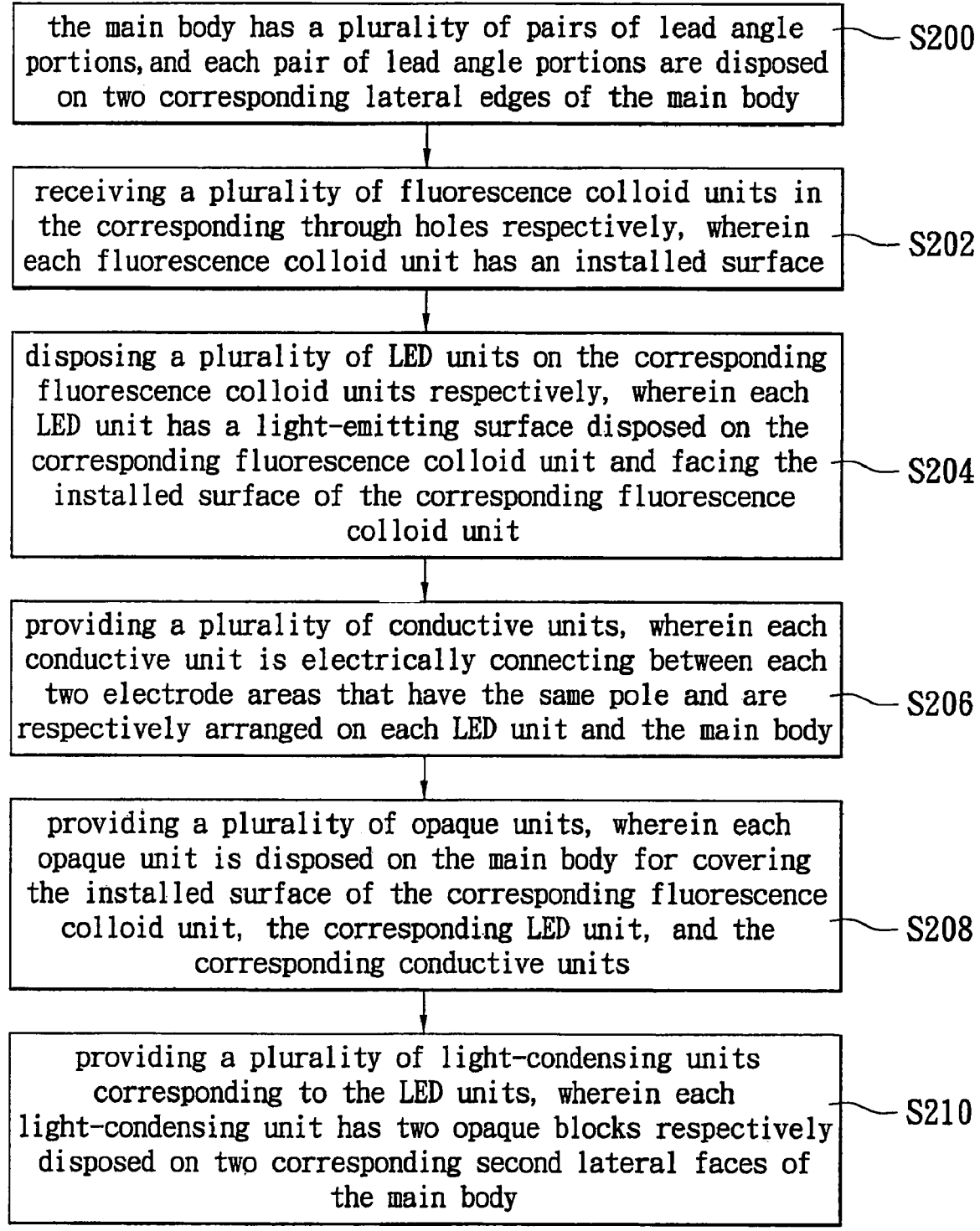
FIG. 9 is a flow chart of a method of packaging an LED package structure for increasing light-emitting efficiency according to the second embodiment of the present invention.

Referring to FIG. 9, the second embodiment of the present invention provides a method of packaging an LED package structure for increasing light-emitting efficiency. The second embodiment has the steps of S202 to S210 same to the steps of S102 to S110 of the first embodiment in sequence.

However, the difference between the second embodiment and the first embodiment is that in the first embodiment the main body 10 has a plurality of pairs of lead angle portions 15, and each pair of lead angle portions 15 are disposed on two corresponding lateral edges 103 of the main body 10 (S200), and the two corresponding lateral edges 103 are for condensing light source that projects from the corresponding LED unit 3 and through the corresponding opaque unit 2.

Figure 10:
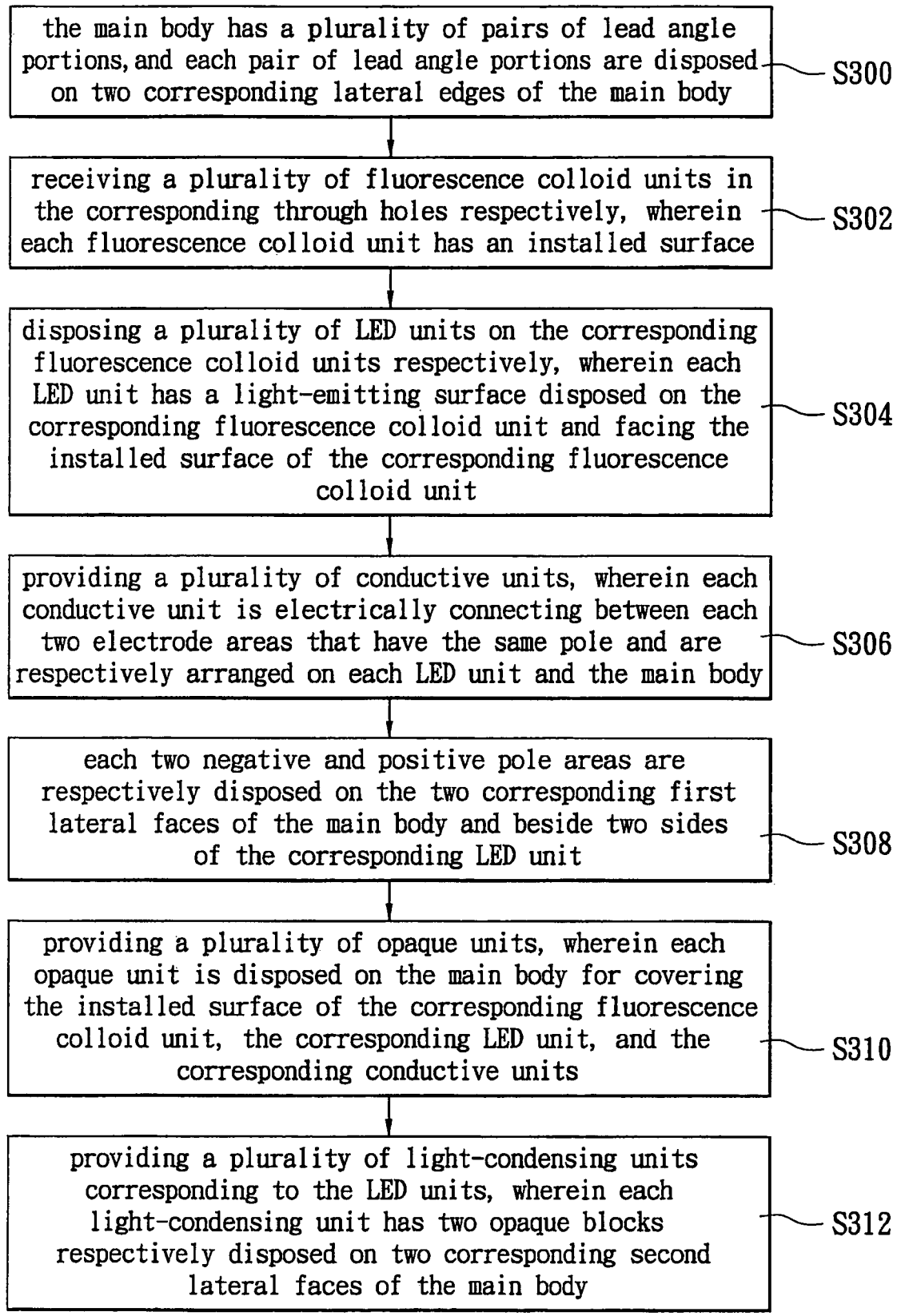
FIG. 10 is a flow chart of a method of packaging an LED package structure for increasing light-emitting efficiency according to the third embodiment of the present invention.

Referring to FIG. 10, the third embodiment of the present invention provides a method of packaging an LED package structure for increasing light-emitting efficiency. The third embodiment has the steps of S300-S306 and S310-S312 same to the steps of S200-S210 of the second embodiment in sequence.

However, the difference between the third embodiment and the second embodiment is that the LED package structure of the third embodiment further comprises a plurality of antistatic units 7. Each antistatic unit 7 is disposed on the first lateral face 101 of the main body 10 and beside one side of the corresponding LED unit 3. Moreover, each antistatic unit 7 has a positive pole area 71 and a negative pole area 72 electrically connected with two corresponding negative and positive pole areas 11', 12' via two corresponding conductive units 41', 42' respectively. In addition, each antistatic unit 7 is used to prevent the corresponding LED unit 3 from being affected or damaged by static.

Furthermore, the positive pole area 71 and the negative pole area 72 of each antistatic unit 7 are disposed on a top side 701 of each antistatic unit 7. In addition, each two negative and positive pole areas 11', 12' are respectively disposed on the two corresponding first lateral faces 101 of the main body 10 and beside two sides of the corresponding LED unit 3 (S308).

Figure 11:
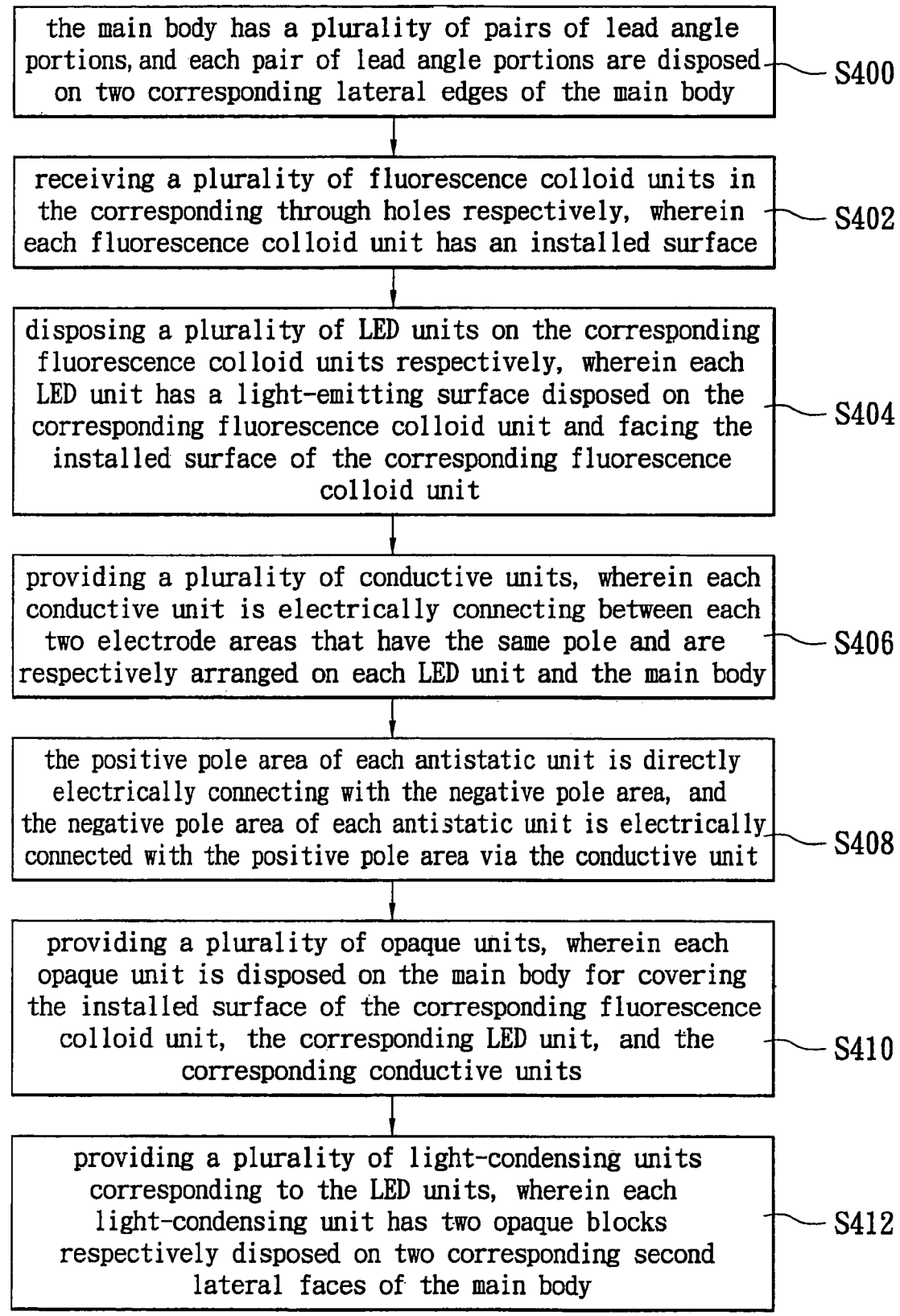
FIG. 11 is a flow chart of a method of packaging an LED package structure for increasing light-emitting efficiency according to the fourth embodiment of the present invention.

Referring to FIG. 11, the fourth embodiment of the present invention provides a method of packaging an LED package structure for increasing light-emitting efficiency. The fourth embodiment has the steps of S400-S406 and S410-S412 same to the steps of S300-S306 and S310-S312 of the second embodiment in sequence.

However, the difference between the fourth embodiment and the third embodiment is that a positive pole area 71' and a negative pole area 72' of each antistatic unit 7' are disposed on a bottom side 701' and a top side 702' of each antistatic unit 7'. Hence, the positive pole area 71' of each antistatic unit 7' is directly electrically connecting with the negative pole area 11', and the negative pole area 72' of each antistatic unit 7' is electrically connected with the positive pole area 12' via the conductive unit 42' (S408) for preventing the corresponding LED unit 3 from being affected or damaged by static.

In conclusion, an LED of the present invention can be packaged on a substrate via a wire-bonding process, and a fluorescence colloid of the present invention can be covered on the LED via a way of die molding, printing, or injection molding. Moreover, the LED's light-emitting surface is disposed on the fluorescence colloid. Hence, when light source of the LED is projected outwardly from the light-emitting surface and through the fluorescence colloid, there is no any projected shadow area shadowed on the LED. So the present invention can solve the prior art's question that there are projected shadow lines shadowed on the LED.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED package structure for increasing light-emitting efficiency, comprising:
   a substrate unit having a main body and a plurality of through holes passing through the main body;
   a plurality of fluorescence colloid units, each received in the corresponding through hole and having an installed surface;
   a plurality of LED units, each having a light-emitting surface disposed on the corresponding fluorescence colloid unit and facing the installed surface of the corresponding fluorescence colloid units;
   a plurality of conductive units, each electrically connected between each two electrode areas that have the same pole and are respectively arranged on each LED unit and the main body;
   a plurality of opaque units, each disposed on two corresponding lateral faces of the main body for covering the installed surface of the corresponding fluorescence colloid unit, the corresponding LED unit, and the corresponding conductive units; and
   a plurality of light-condensing units corresponding to the LED units, wherein each light-condensing unit has two opaque blocks respectively disposed on the main body's another two corresponding lateral faces that are opposite to the two corresponding lateral faces of the main body for condensing light source that projects from the corresponding LED unit and through the corresponding opaque unit.

2. The LED package structure as claimed in claim 1, wherein the main body has a plurality of pairs of lead angle portions, and each pair of lead angle portions are respectively formed on the main body's two corresponding lateral edges for condensing light source that projects from the corresponding LED unit and through the corresponding opaque unit.

3. The LED package structure as claimed in claim 1, wherein the through holes are passed through the main body via a way of etching or punching.

4. The LED package structure as claimed in claim 1, wherein the fluorescence colloid units are respectively received in the through holes via a way of die molding, printing, or injection molding.

5. The LED package structure as claimed in claim 1, wherein each LED unit has a positive pole area and a negative pole area electrically connected with two corresponding positive and negative pole areas via two corresponding conductive units respectively, wherein each two corresponding positive and negative pole areas are respectively disposed on two corresponding lateral faces of the main body and beside two sides of the corresponding LED unit.

6. The LED package structure as claimed in claim 1, further comprising a plurality of antistatic units, wherein each antistatic unit is disposed on the main body and beside one side of the corresponding LED unit.

7. The LED package structure as claimed in claim 6, wherein each antistatic unit has a positive pole area and a negative pole area electrically connected with two corresponding negative and positive pole areas via two corresponding conductive units respectively, wherein each two negative and positive pole areas are respectively disposed on two lateral faces of the main body and beside two sides of the corresponding LED unit.

8. The LED package structure as claimed in claim 7, wherein the positive pole area and the negative pole area of each antistatic unit are disposed on a top side of each antistatic unit.

9. The LED package structure as claimed in claim 6, wherein each antistatic unit has a positive pole area directly connected with a corresponding negative pole area and a negative pole area connected with a corresponding positive pole area via a corresponding conductive unit, wherein the two corresponding negative and positive pole areas are respectively disposed on the two corresponding lateral faces of the main body and beside two sides of the corresponding LED unit.

10. The LED package structure as claimed in claim 9, wherein the positive pole area and the negative pole area of each antistatic unit are disposed on a bottom side and a top side of each antistatic unit for the positive pole area of each antistatic unit electrically connecting with the negative pole area.

11. A method of packaging an LED package structure for increasing light-emitting efficiency, comprising:
   providing a substrate unit that has a main body and a plurality of through holes passing through the main body;
   receiving a plurality of fluorescence colloid units in the corresponding through holes respectively, wherein each fluorescence colloid unit has an installed surface;
   disposing a plurality of LED units on the corresponding fluorescence colloid units respectively, wherein each LED unit has a light-emitting surface disposed on the corresponding fluorescence colloid unit and facing the installed surface of the corresponding fluorescence colloid unit;
   providing a plurality of conductive units, wherein each conductive unit is electrically connecting between each two electrode areas that have the same pole and are respectively arranged on each LED unit and the main body;
   providing a plurality of opaque units, wherein each opaque unit is disposed on two corresponding lateral faces of the main body for covering the installed surface of the corresponding fluorescence colloid unit, the corresponding LED unit, and the corresponding conductive units; and providing a plurality of light-condensing units corresponding to the LED units, wherein each light-condensing unit has two opaque blocks respectively disposed on the main body's another two corresponding lateral faces that are opposite to the two corresponding lateral faces of the main body for condensing light source that projects from the corresponding LED unit and through the corresponding opaque unit.

12. The method as claimed in claim 11, wherein the main body has a plurality of pairs of lead angle portions, and each pair of lead angle portions are respectively formed on the main body's two corresponding lateral edges for condensing light source that projects from the corresponding LED unit and through the corresponding opaque unit.

13. The method as claimed in claim 11, wherein the through holes are passed through the main body via a way of etching or punching.

14. The method as claimed in claim 11, wherein the fluorescence colloid units are respectively received in the through holes via a way of die molding, printing, or injection molding.

15. The method as claimed in claim 11, wherein each LED unit has a positive pole area and a negative pole area electrically connected with two corresponding positive and negative pole areas via two corresponding conductive units respectively, wherein each two corresponding positive and negative pole areas are respectively disposed on two corresponding lateral faces of the main body and beside two sides of the corresponding LED unit.

16. The method as claimed in claim 11, further comprising a plurality of antistatic units, wherein each antistatic unit is disposed on the main body and beside one side of the corresponding LED unit.

17. The method as claimed in claim 16, wherein each antistatic unit has a positive pole area and a negative pole area electrically connected with two corresponding negative and positive pole areas via two corresponding conductive units respectively, wherein each two negative and positive pole areas are respectively disposed on the two corresponding lateral faces of the main body and beside two sides of the corresponding LED unit.

18. The method as claimed in claim 17, wherein the positive pole area and the negative pole area of each antistatic unit are disposed on a top side of each antistatic unit.

19. The method as claimed in claim 16, wherein each antistatic unit has a positive pole area directly connected with a corresponding negative pole area and a negative pole area connected with a corresponding positive pole area via a corresponding conductive unit, wherein the two corresponding negative and positive pole areas are respectively disposed on the two corresponding lateral faces of the main body and beside two sides of the corresponding LED unit.

20. The method as claimed in claim 19, wherein the positive pole area and the negative pole area of each antistatic unit are disposed on a bottom side and a top side of each antistatic unit for the positive pole area of each antistatic unit electrically connecting with the negative pole area.

* * * * *